United States Patent
Wei

(10) Patent No.: US 10,491,226 B1
(45) Date of Patent: Nov. 26, 2019

(54) METHOD, PROCESSING CIRCUIT, AND WIRELESS COMMUNICATION DEVICE CAPABLE OF TUNING CURRENT PROVIDED FOR DCO TO LOWER CURRENT LEVEL AS FAR AS POSSIBLE

(71) Applicant: PixArt Imaging Inc., Hsin-Chu (TW)

(72) Inventor: Lien-Sheng Wei, Hsin-Chu (TW)

(73) Assignee: Audiowise Technology Inc., Hsinchu County (TW)

( * ) Notice: Subject to any disclaimer, the term of this patent is extended or adjusted under 35 U.S.C. 154(b) by 0 days.

(21) Appl. No.: 16/234,480

(22) Filed: Dec. 27, 2018

(51) Int. Cl.
*H03L 7/099* (2006.01)
*H04L 7/033* (2006.01)

(52) U.S. Cl.
CPC .......... *H03L 7/0991* (2013.01); *H04L 7/0331* (2013.01)

(58) Field of Classification Search
CPC ............................ H03L 7/0991; H04L 7/0331
USPC ......................................... 327/150, 153, 161
See application file for complete search history.

(56) References Cited

U.S. PATENT DOCUMENTS

| | | | | |
|---|---|---|---|---|
| 8,299,862 B1* | 10/2012 | De Bernardinis | ... | H03B 5/1228 331/117 FE |
| 9,379,721 B2* | 6/2016 | Pavao-Moreira | ....... | H03L 7/099 |
| 2010/0013531 A1* | 1/2010 | Ainspan | ................. | H03L 7/093 327/159 |
| 2011/0089982 A1* | 4/2011 | Hsieh | ...................... | H03L 7/091 327/156 |
| 2015/0015346 A1* | 1/2015 | Jou | ......................... | H03J 5/246 334/55 |
| 2017/0040943 A1* | 2/2017 | Pavao-Moreira | .... | H03B 5/1265 |

* cited by examiner

*Primary Examiner* — John W Poos
(74) *Attorney, Agent, or Firm* — Winston Hsu

(57) ABSTRACT

A method for tuning a current source of a digitally controlled oscillator having an LC tank having a tunable capacitor bank includes: determining a specific threshold according to a resolution of a bit number of the tunable capacitor bank; configuring a current flowing through the current source at a first current level; tuning the current flowing through the current source from the first current level to a lower current level; comparing a variation of a digital value of the tunable capacitor bank with the specific threshold, the digital value corresponding to the lower current level; and determining that a current level required by the digitally controlled oscillator is decreased down to the lower current level and then configuring the current flowing through the current source at the lower current level if the variation of the digital value is smaller than the specific threshold.

18 Claims, 2 Drawing Sheets

METHOD, PROCESSING CIRCUIT, AND WIRELESS COMMUNICATION DEVICE CAPABLE OF TUNING CURRENT PROVIDED FOR DCO TO LOWER CURRENT LEVEL AS FAR AS POSSIBLE

BACKGROUND OF THE INVENTION

1. Field of the Invention

The invention relates to a current calibration mechanism, and more particularly to a method for tuning a current source of a digitally controlled oscillator based on a digital value of a tunable capacitor bank in the digitally controlled oscillator.

2. Description of the Prior Art

Generally speaking, with the evolution of sub-micrometer CMOS process, a traditional phase-locked-loop (PLL) is superseded by a digital phase-locked-loop (DPLL). In the DPLL, a digitally controlled oscillator (DCO) with its crucial impact in phase noise and resolution is a vital block in the DPLL. The DCO is a key component of power consumption of the DPLL. The performance of power consumption of DCO dominates the DPLL.

A conventional scheme may be arranged to configure the current proved to the DCO as a maximum or enough large current so as to make sure that the DCO can start oscillation as well as the DPLL can operate under different channel frequencies over a particular channel frequency range. The maximum or enough large current for example may be selected as 3 mA in Bluetooth communication. However, this choice of current does not meet the requirement of low power design.

SUMMARY OF THE INVENTION

Therefore one of the objectives of the invention is to provide method, processing circuit, and wireless communication device for tuning a current source of a digitally controlled oscillator based on a digital value of a tunable capacitor bank in the digitally controlled oscillator, to solve the above-mentioned problems.

According to embodiments of the invention, a method for tuning a current source of a digitally controlled oscillator having an LC tank having a tunable capacitor bank is disclosed. The method comprises: determining a specific threshold according to a resolution of a bit number of the tunable capacitor bank; configuring a current flowing through the current source at a first current level; tuning the current flowing through the current source from the first current level to a lower current level; comparing a variation of a digital value of the tunable capacitor bank with the specific threshold, the digital value corresponding to the lower current level; and, determining that a current level required by the digitally controlled oscillator is decreased down to the lower current level and then configuring the current flowing through the current source at the lower current level if the variation of the digital value is smaller than the specific threshold.

According to the embodiments, a communication electronic device is disclosed. The device comprises a digital phase-locked loop and a processing circuit. The digital phase-locked loop has a digitally controlled oscillator having a current source and an LC tank, and the LC tank has a tunable capacitor bank. The processing circuit is coupled to the digital phase-locked loop, and is used for: determining a specific threshold according to a resolution of a bit number of the tunable capacitor bank; configuring a current flowing through the current source at a first current level; tuning the current flowing through the current source from the first current level to a lower current level; comparing a variation of a digital value of the tunable capacitor bank with the specific threshold, the digital value corresponding to the lower current level; and, determining that a current level required by the digitally controlled oscillator is decreased down to the lower current level and then configuring the current flowing through the current source at the lower current level if the variation of the digital value is smaller than the specific threshold.

According to the embodiments, a processing circuit for tuning a current source of a digitally controlled oscillator of a digital phase-locked loop is disclosed. The processing circuit is coupled to the digital phase-locked loop having the digitally controlled oscillator having a current source and an LC tank, and the LC tank has a tunable capacitor bank. The processing circuit comprises a controlling circuit. The controlling circuit is coupled to the digitally controlled oscillator, and is used for: determining a specific threshold according to a resolution of a bit number of the tunable capacitor bank; configuring a current flowing through the current source at a first current level; tuning the current flowing through the current source from the first current level to a lower current level; comparing a variation of a digital value of the tunable capacitor bank with the specific threshold, the digital value corresponding to the lower current level; and, determining that a current level required by the digitally controlled oscillator is decreased down to the lower current level and then configuring the current flowing through the current source at the lower current level if the variation of the digital value is smaller than the specific threshold.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a solution/mechanism capable of calibrating/tuning or decreasing the current of a current source included within a digitally controlled oscillator (DCO) of a digital phase-locked loop (DPLL) to set/configure such current of the current source at a lower/minimum current value/level to reduce power consumption of the DCO/DPLL as far as possible. The invention aims at finding a smaller or minimum current level required by the DCO under a condition of the DPLL being capable of tracking/locking channel frequencies and then setting/configuring the current of the current source at such smaller or minimum current level to reduce power consumption.

Figure 1:
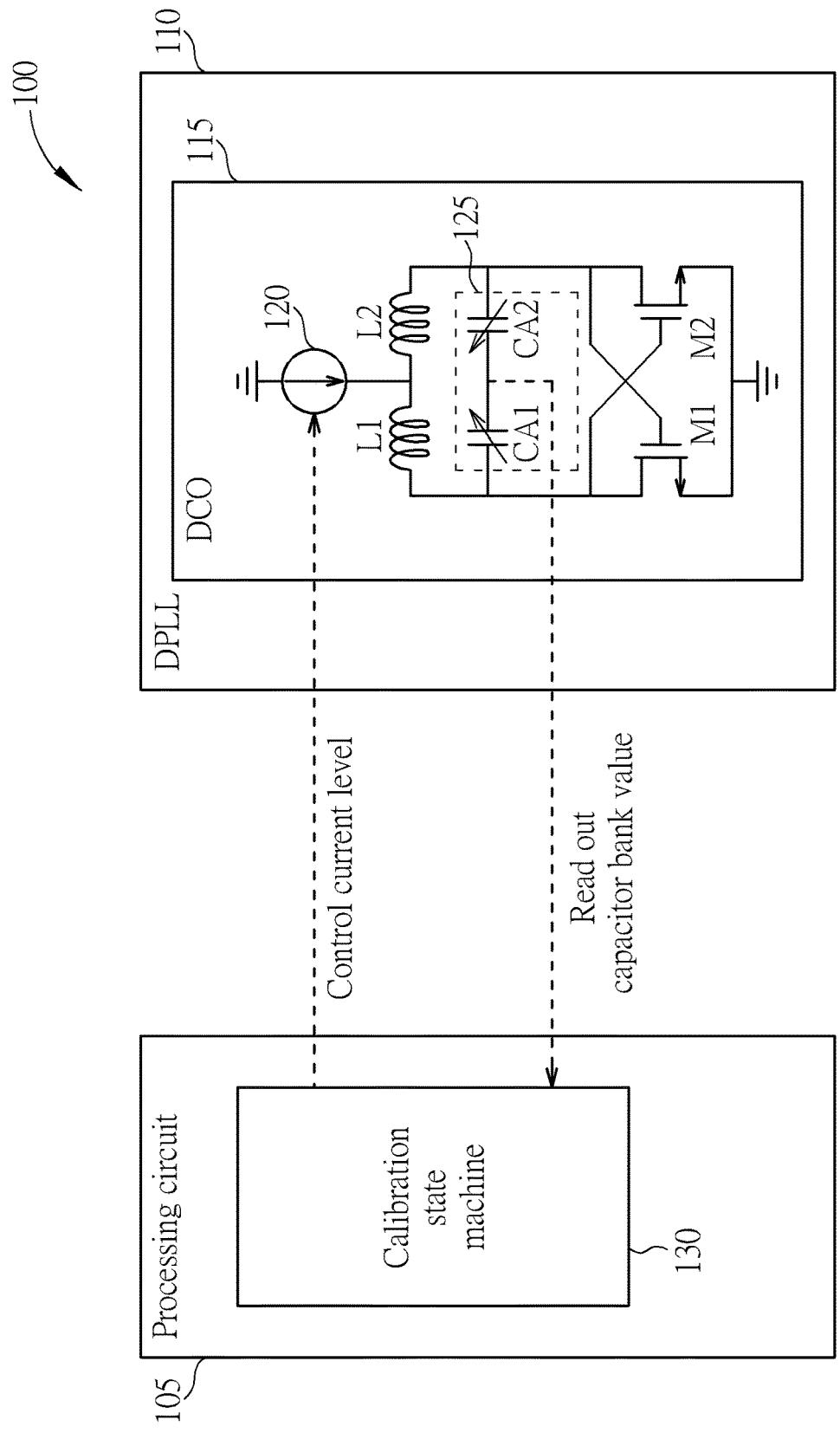
FIG. 1 is a block diagram of a wireless communication device according to embodiments of the invention.

FIG. 1 is a block diagram of a wireless communication device 100 according to embodiments of the invention. The wireless communication device 100 for example is a Bluetooth communication device or a Wi-Fi communication device (but not limited) and comprises a processing circuit 105 and a DPLL 110 such as all digital phase-locked loop (ADPLL). DPLL 110 comprises the DCO 115 which comprises a current source 120, an LC tank, and a cross-coupled pair (formed by transistors M1 and M2) wherein the LC tank comprises two inductive elements L1 and L2 and a tunable capacitor bank 125 having two tunable capacitive elements/arrays CA1 and CA2 and a register circuit (not shown in FIG. 1); corresponding circuit connections are shown on FIG. 1 and are not detailed for brevity.

The capacitor bank 125 is arranged to store or update information/value of the capacitor bank 125 in the register circuit. For example, when the DPLL 110 is arranged to track a specific frequency, the DPLL 110 is arranged to dynamically adjust or tune the capacitance value of the capacitor bank 125 by generating and using a digital code word signal to control and adjust at least one of capacitance values of the two tunable capacitive elements/arrays C1 and C2. The inductance determined by the inductive elements L1 and L2 and the capacitance value of the capacitor bank 125 are arranged to dominate the oscillation frequency generated from the DCO 115.

The digital code word signal may carry different digital code words which are used to respectively control and adjust the capacitance of the capacitor bank 125 at different capacitance values, and the different digital code words respectively indicate different digital values. The digital code word signal can be used to adjust the capacitance value of the capacitor bank 125 from a minimum capacitance value to a maximum capacitance value over a range to correspondingly adjust and control the generated oscillation frequency vary over a particular frequency range. When/after the DPLL 110 successfully tracks a particular the frequency each time, the final or resultant digital code word carried by the digital code word signal is recorded or stored in the register circuit of capacitor bank 125. In practice, if the DPLL 110 needs to wait for an identical time period to finish frequency locking each time, then the digital code word can be recorded in the register circuit after the identical time period expires each time. Alternatively, the DPLL 110 may be arranged to update the digital code word stored in the register circuit each time when the DPLL 110 uses a different digital code word to tune the capacitance value of the capacitor bank. In addition, a digital value corresponding to such final or resultant digital code word recorded in the register circuit when the DPLL 110 successfully tracks the particular the frequency can be regarded as a capacitor bank value of the DCO 115.

The processing circuit 105 for example may be a baseband digital signal processor (DSP) including a controlling circuit 130 such as a calibration state machine and uses the controlling circuit 130 to adjust or tune the current of the current source 120. In practice, the current adjustment/calibration operation/procedure mentioned in the following paragraphs is performed by using the calibration state machine 130. The current source 120 is configured and placed between a power supply voltage level and the LC tank. The current source 120 is used for providing a current to the LC tank.

The processing circuit 105 is arranged to read out the digital value stored in the register circuit of the capacitor bank 125 and then adjust or tune the current of the current source 120 to decrease such current as far as possible so as to save more power according to the read digital value.

The processing circuit 105 is arranged to calculate or determine a smaller or minimum requirement current value/level to set or configure the current of the current source 120 for the DCO 115 so as to reduce the power consumption of DCO 115 as far as possible. The smaller or minimum requirement current value/level means that a smaller or minimum current level which is required by the DCO 115 when the DPLL 110 still successfully tracks or locks at least one particular frequency.

For example, the processing circuit 105 is arranged to decrease the current flowing through the current source 120 from a first current level to a second current level that is slightly lower than the first current level and then is arranged to check whether the DCO 115 or DPLL 110 still tracks or locks the particular frequency. If the DCO 115 or DPLL 110 using the lower current level fails to track or lock the particular frequency, then the processing circuit 105 uses the previous current level, i.e. the slightly higher current level to configure or set the current of the current source 120. The processing circuit 105 may decrease down the current of the current source 120 step by step based on a fixed step size or may decrease down the current gradually without the fixed step size.

The DPLL 110 may be used to lock and track one frequency over a specific channel frequency range such as from 2462 MHz to 2480 MHz for a kind of Bluetooth communication scheme (but not limited). In practice, the processing circuit 105 is arranged to dynamically tune the current flowing through the current source 120 for at least one channel frequency so as to determine and set the current of current source 120 at a smaller or minimum current level as far as possible under a condition that the DPLL 110 still successfully tracks or locks the frequency.

Figure 2:
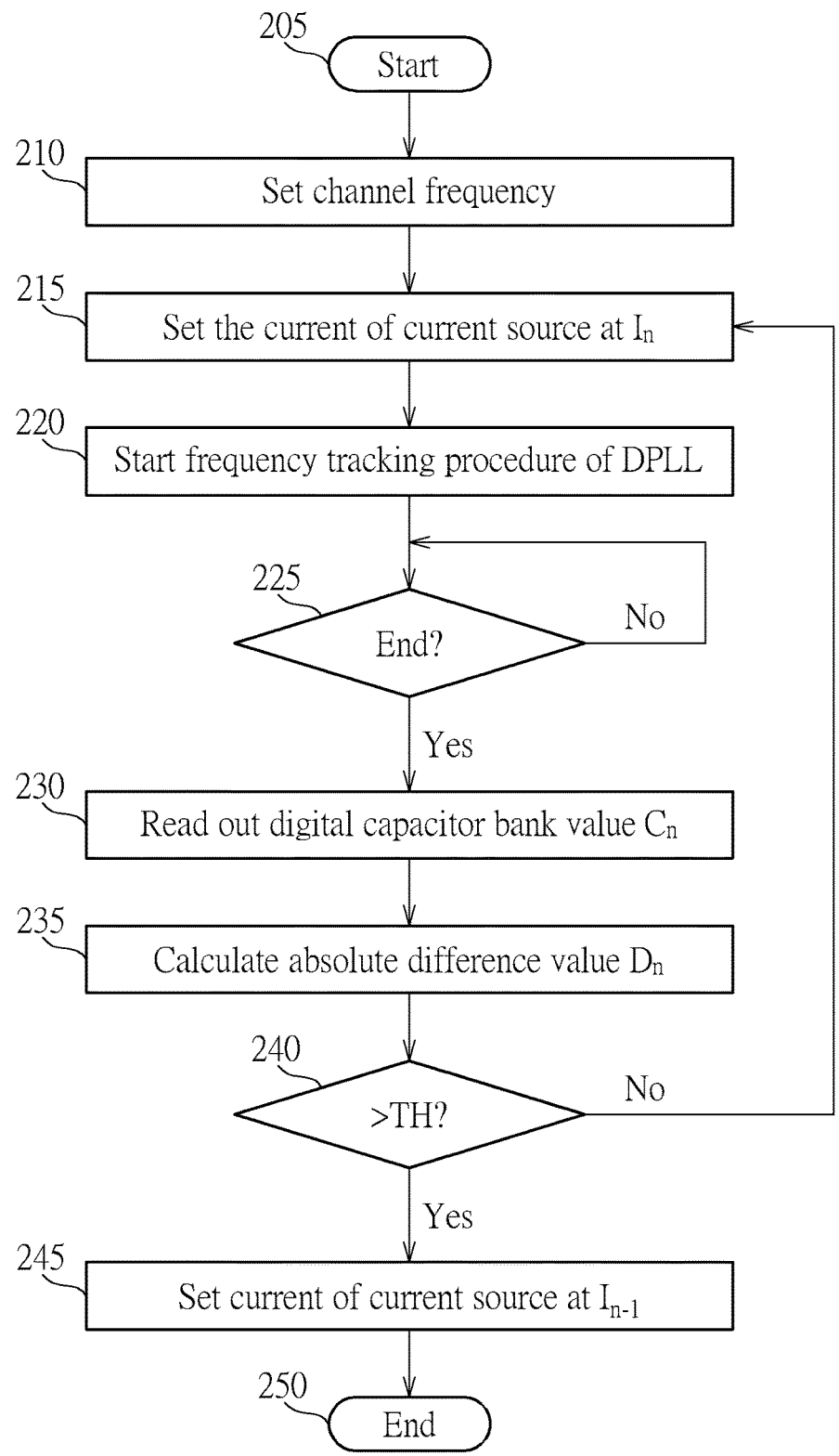
FIG. 2 is a diagram of a flowchart of a method capable of tuning/adjusting the current flowing through a current source of an oscillator included within the wireless communication device as shown in FIG. 1 at a smaller or minimum current value/level according to the embodiments of the invention.

FIG. 2 is a diagram of a flowchart of a method capable of tuning/adjusting the current flowing through a current source of an oscillator included within the wireless communication device 100 as shown in FIG. 1 at a smaller or minimum current value/level according to the embodiments of the invention. Provided that substantially the same result is achieved, the steps of the flowchart shown in FIG. 2 need not be in the exact order shown and need not be contiguous, that is, other steps can be intermediate. Steps are detailed in the following:

Step 205: Start;

Step 210: Set a channel frequency;

Step 215: Set the current of current source 120 at a smaller current such as a lower current level $I_n$ which is lower than a previously tuned current level $I_{n-1}$;

Step 220: Start the frequency tracking procedure of DPLL 110;

Step 225: Is the frequency tracking procedure of DPLL 110 finished or ended? If the procedure ends, then the flow proceeds to Step 230, otherwise, the flow proceeds to Step 225;

Step 230: Readout the digital capacitor bank value $C_n$ recorded in the register circuit from the capacitor bank 125;

Step 235: Calculate an absolute difference value $D_n$ between the readout digital capacitor bank value $C_n$ and the reference digital capacitor bank value $C_0$;

Step 240: Determine whether the absolute difference value $D_n$ is larger than the threshold TH; if the absolute difference value $D_n$ is larger than the threshold TH, then the flow proceeds to Step 245, otherwise, the flow proceeds to Step 215;

Step 245: Determine that the smaller or minimum requirement current of DCO 115 is equal to or larger than the current of the previously tuned current level $I_{n-1}$, and set the current of current source 120 at the previously tuned current level $I_{n-1}$; and Step 250: End.

In the embodiment, initially, the processing circuit 105 is arranged to determine a specific threshold TH according to a resolution of a bit number of the tunable capacitor bank 125. The bit number of the tunable capacitor bank 125 is used to indicate or represent different digital values associated with the capacitance values over a tunable range for the tunable capacitor bank 125. For example, the threshold TH may be configured as 30 (but not limited).

The DPLL 110 may receive and operate under multiple channel frequencies over a channel frequency range. In Step 210, the processing circuit 105 may select or set a channel frequency for the DPLL 110 or the DPLL 110 may select a channel frequency based on a design requirement or a setting of a user. Also in Step 210, the processing circuit 105 is arranged to set/configure the current flowing through the current source 120 at a maximum or an enough large current value/level such as $I_0$; the iteration number n of the frequency tracking procedure is equal to zero. The maximum or enough large current value/level $I_0$ for example is equal to 3 mA (but not limited) and can make sure that the DCO 115 can start oscillation and the DPLL 110 should be able to successfully track/lock frequencies over the channel frequency range. Usually the higher current level, the DCO 115 starts oscillation more easily. Based on the maximum or enough large current $I_0$, the DPLL 110 starts to track and lock the selected channel frequency. After the DPLL 110 has locked and tracked the selected channel frequency, the processing circuit 105 is arranged to read out a capacitor bank value $C_0$ from the register circuit. Then the processing circuit 105 configures the capacitor bank value $C_0$ as a reference capacitor bank value. The reference capacitor bank value $C_0$ for example is equal to 256 (but not limited).

In Step 215, the processing circuit 105 tunes or calibrates the current flowing through the current source 120 from the current level $I_0$ to a lower current level by decreasing and controlling the current flowing through the current source 120 at a current level $I_1$ which is lower than the current level $I_0$; the iteration number n is equal to 1. For example, the current level $I_1$ is equal to 2.5 mA; however, this is not intended to be a limitation.

Then, in Step 220, the DPLL 110 starts the frequency tracking operation/procedure to track the selected channel frequency. The processing circuit 105 is arranged to wait for the execution of the frequency tracking operation/procedure that is performed based on the current level $I_1$. In Step 225, the processing circuit 105 is arranged determine whether the frequency tracking operation/procedure is finished or ended. If the frequency tracking operation/procedure is finished, the flow proceeds to Step 230, otherwise, the flow proceeds back to Step 225.

After the frequency tracking operation/procedure is finished, in Step 230 the processing circuit 105 is arranged to read out a corresponding capacitor bank value $C_1$ from the register circuit. The capacitor bank value $C_1$ for example is equal to 258.

In Step 235, the processing circuit 105 is arranged to calculate the absolute difference value $D_1$ between the capacitor bank value $C_1$ and the reference capacitor bank value $C_0$. The calculated absolute difference value $D_1$ is equal to 2 since the capacitor bank value $C_1$ is equal to 258 and the reference capacitor bank value $C_0$ is equal to 256.

In Step 240, the processing circuit 105 compares the absolute difference value $D_1$ with the threshold value TH such as 30 to determine whether the DPLL 110 can still lock/track the selected channel frequency. Since the absolute difference value $D_1$ is equal to 2 which is smaller than the threshold value TH, the processing circuit 105 determines that the DPLL 110 can successfully lock/track the selected channel frequency. The processing circuit 105 then is arranged to try to decreasing the current flowing the current source 120 so as to find a smaller requirement current for the DCO 120 as far as possible. The flow proceeds back to Step 215, and the processing circuit 105 sets the current flowing through the current source 120 at a lower current level $I_2$ which is lower than the previously tuned current level $I_1$. For example, the current level $I_2$ may be equal to 2 mA.

Similarly, after the current of current source 120 is configured at 2 mA of current level $I_2$, the DPLL 110 starts the frequency tracking operation for the same selected channel frequency. After the frequency tracking operation is ended, the processing circuit 105 is arranged to read out the capacitor bank value $C_2$ from the register circuit. The capacitor bank value $C_2$ for example is equal to 260. The processing circuit 105 then calculates an absolute difference value $D_2$ between the capacitor bank value $C_2$ and the reference capacitor bank value $C_0$ to obtain that the absolute difference value $D_2$ after calculation is equal to 4. The processing circuit 105 compares such absolute difference value $D_2$ with the threshold value TH and then determines that the DPLL 110 can still successfully lock/track the selected channel frequency based on the current level $I_2$. The processing circuit 105 then is arranged to try to decreasing the current flowing the current source 120 so as to find a smaller requirement current for the DCO 120 as far as possible. The flow proceeds back to Step 215, and the processing circuit 105 sets the current flowing through the current source 120 at a lower current level $I_3$ which is lower than the previously tuned current level $I_2$. For example, the current level $I_3$ may be equal to 1.5 mA.

Similarly, after the current of current source 120 is configured at 1.5 mA of current level $I_3$, the DPLL 110 starts the frequency tracking operation for the same selected channel frequency. After the frequency tracking operation is ended, the processing circuit 105 is arranged to read out the capacitor bank value $C_3$ from the register circuit. The capacitor bank value $C_3$ for example is equal to 255. The processing circuit 105 then calculates an absolute difference value $D_3$ between the capacitor bank value $C_3$ and the reference capacitor bank value $C_0$ to obtain that the absolute difference value $D_3$ after calculation is equal to 1. The processing circuit 105 compares such absolute difference value $D_3$ with the threshold value TH and then determines that the DPLL 110 successfully locks/tracks the selected channel frequency based on the current level $I_3$. The processing circuit 105 then is arranged to try to decreasing the current flowing the current source 120 so as to find a smaller requirement current for the DCO 120 as far as possible. The flow proceeds back to Step 215, and the processing circuit 105 sets the current flowing through the current source 120 at a lower current level $I_4$ which is lower than the previously tuned current level $I_3$. For example, the current level $I_4$ may be equal to 1 mA.

After the current of current source 120 is controlled at 1 mA of current level $I_4$, the DPLL 110 starts the frequency tracking operation for the same selected channel frequency. After the frequency tracking operation is ended, the processing circuit 105 is arranged to read out the capacitor bank value $C_4$ from the register circuit. The capacitor bank value $C_4$ for example is equal to 300. The processing circuit 105 then calculates an absolute difference value $D_4$ between the capacitor bank value $C_4$ and the reference capacitor bank value $C_0$ to obtain that the absolute difference value $D_4$ after calculation is equal to 44. The processing circuit 105 compares such absolute difference value $D_4$ with the threshold value TH and then determines that the DPLL 110 based on the current level $I_4$ fails to lock/track the selected channel frequency. In this situation, the processing circuit 105 does not try to decrease the current flowing the current source 120 again. In Step 245, the processing circuit 105 determines that the smaller or minimum requirement current for the DCO 115 may be equal to or larger than the current of the previously tuned current level $I_3$ so that the DCO 115 based on the current level $I_3$ can start oscillation as well as the DPLL 110 can successfully track or lock the selected channel frequency.

In one embodiment, the processing circuit 105 may set the current of current source 120 at the previously tuned current level $I_3$. However, in other embodiments, the processing circuit 105 may set the current of current source 120 at other previously tuned current level $I_2$ or $I_1$. The modifications also obey the spirit of the invention.

In other words, the processing circuit 105 is arranged to decrease the current flowing through the current source 120 as far as possible to reduce power consumption under the condition that the DCO 115 can start oscillation as well as the DPLL 110 can still successfully track or lock the selected channel frequency. If the DPLL 110 based on a current level, which is lower than a previously tuned current level, can still successfully track or lock the selected channel frequency, the processing circuit 105 determines that the current level actually required by the DCO 115 (or DPLL 110) can be decreased down to such lower current level and thus configures the current of current source 120 at such lower current level so as to reduce power consumption.

The above-mentioned current adjustment/calibration procedure shown in FIG. 2 is used for tuning the current of current source 120 for a particular selected channel frequency over a channel frequency range. In one embodiment, the processing circuit 105 may perform the above current calibration procedure for a single channel frequency and uses a resultant current level determined by the current adjustment result based on the single channel frequency to configure the current of DCO 115 when the DCO 115 operates for all possible channel frequencies including other different channel frequencies. The advantage is that it is only required for the processing circuit 105 to perform the above calibration procedure for the single channel frequency one time without repeating the procedure for other possible channel frequencies. In other embodiments, the processing circuit 105 can be arranged to perform the above current calibration procedure for a highest channel frequency and a lowest channel frequency over the channel frequency range respectively. For example, the processing circuit 105 may obtain two different current levels for the highest channel frequency and the lowest channel frequency. In this situation, the processing circuit 105 is arranged to select a higher one among the two different current levels as the smaller/minimum requirement current of DCO 115 for all possible channel frequencies over the channel frequency range. The processing circuit 105 can be arranged to repeatedly perform the current calibration procedure for multiple or all possible channel frequencies to more accurately determine the smaller/minimum requirement current of DCO 115.

Further, in one embodiment, the current source 120 may be configured as a tail current source which is placed between the LC tank and a ground level. This medication also falls within the scope of the invention.

Further, the processing circuit 105 can activate the current calibration procedure for the DPLL 110 each time when the wireless communication device 100 is powered again. It should be noted that the current level required by a DCO to start oscillation may vary due to a variety of factors such as manufacturing process variations, corner variations, temperature variations, and/or other environment factors. To more accurately control the current of current source 120 at a smaller or minimum current level, in one embodiment the current calibration procedure for the DPLL 110 is arranged to be performed each time when the wireless communication device 100 is powered again.

In addition, since the current calibration can be executed by the processing circuit 105, no extra instrument devices are needed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for tuning a current source of a digitally controlled oscillator having an LC tank having a tunable capacitor bank, and the method comprises:
    determining a specific threshold according to a resolution of a bit number of the tunable capacitor bank;
    configuring a current flowing through the current source at a first current level;
    tuning the current flowing through the current source from the first current level to a lower current level;
    comparing a variation of a digital value of the tunable capacitor bank with the specific threshold, the digital value corresponding to the lower current level; and
    determining that a current level required by the digitally controlled oscillator is decreased down to the lower current level and then configuring the current flowing through the current source at the lower current level if the variation of the digital value is smaller than the specific threshold.

2. The method of claim 1, further comprising:
    reading the digital value from the tunable capacitor bank as a reference capacitor bank value when the current flowing through the current source is configured as the first current level;
    calibrating the current flowing through the current source from the first current level to a second current level which is lower than the first current level;
    waiting for an execution of a frequency tracking operation which is executed based on the second current level provided for the digitally controlled oscillator;
    reading the digital value from the tunable capacitor bank as a second capacitor bank value when the execution of the frequency tracking operation is finished;
    calculating an absolute difference value between the second capacitor bank value and the reference capacitor bank value;
    comparing the absolute difference value with the specific threshold; and
    determining that the current level required by the digitally controlled oscillator is decreased down to the second current level and then configuring the current flowing through the current source at the second current level if the absolute difference value is smaller than the specific threshold.

3. The method of claim 2, wherein the digitally controlled oscillator is applied to a digital phase-locked loop which is arranged to support different channel frequencies over a channel frequency range, and the calibrating step and waiting step are performed for only a single channel frequency among the different channel frequencies to determine the current level required by the digitally controlled oscillator when the digitally controlled oscillator operates for the different channel frequencies.

4. The method of claim 3, wherein the single channel frequency is a highest channel frequency in the channel frequency range.

5. The method of claim 2, wherein the digitally controlled oscillator is applied to a digital phase-locked loop which is arranged to support different channel frequencies over a channel frequency range, and both the calibrating step and waiting step are performed respectively for a highest channel frequency and a lowest channel frequency in the channel frequency range to determine the current level required by the digitally controlled oscillator when the digitally controlled oscillator operates for the different channel frequencies.

6. The method of claim 2, wherein the digitally controlled oscillator is applied to a digital phase-locked loop which is arranged to support different channel frequencies over a channel frequency range, and both the calibrating step and waiting step are performed respectively for all the different channel frequencies in the channel frequency range to determine the current level required by the digitally controlled oscillator.

7. The method of claim 1, wherein the tuning step comprises:
    decreasing the current flowing through the current source from the first current level to the lower current level based on a fixed step size.

8. The method of claim 1, wherein the tuning step comprises:
    decreasing the current flowing through the current source from the first current level to the lower current level gradually without a fixed step size.

9. A communication electronic device, comprising:
    a digital phase-locked loop having a digitally controlled oscillator having a current source and an LC tank, the LC tank having a tunable capacitor bank; and
    a processing circuit, coupled to the digital phase-locked loop, used for:
        determining a specific threshold according to a resolution of a bit number of the tunable capacitor bank;
        configuring a current flowing through the current source at a first current level;
        tuning the current flowing through the current source from the first current level to a lower current level;
        comparing a variation of a digital value of the tunable capacitor bank with the specific threshold, the digital value corresponding to the lower current level; and
        determining that a current level required by the digitally controlled oscillator is decreased down to the lower current level and then configuring the current flowing through the current source at the lower current level if the variation of the digital value is smaller than the specific threshold.

10. The device of claim 9, wherein the processing circuit is arranged for:
    reading the digital value from the tunable capacitor bank as a reference capacitor bank value when the current flowing through the current source is configured as the first current level;
    calibrating the current flowing through the current source from the first current level to a second current level which is lower than the first current level;
    waiting for an execution of a frequency tracking operation which is executed based on the second current level provided for the digitally controlled oscillator;
    reading the digital value from the tunable capacitor bank as a second capacitor bank value when the execution of the frequency tracking operation is finished;
    calculating an absolute difference value between the second capacitor bank value and the reference capacitor bank value;
    comparing the absolute difference value with the specific threshold; and
    determining that the current level required by the digitally controlled oscillator is decreased down to the second current level and then configuring the current flowing through the current source at the second current level if the absolute difference value is smaller than the specific threshold.

11. The device of claim 10, wherein the digital phase-locked loop is arranged to support different channel frequencies over a channel frequency range, and the processing circuit is arranged to perform the calibrating step and waiting step for only a single channel frequency among the different channel frequencies to determine the current level required by the digitally controlled oscillator when the digitally controlled oscillator operates for the different channel frequencies.

12. The device of claim 11, wherein the single channel frequency is a highest channel frequency in the channel frequency range.

13. The device of claim 10, wherein the digital phase-locked loop is arranged to support different channel frequencies over a channel frequency range, and the processing circuit is arranged for performing both the calibrating step and waiting step respectively for a highest channel frequency and a lowest channel frequency in the channel frequency range to determine the current level required by the digitally controlled oscillator when the digitally controlled oscillator operates for the different channel frequencies.

14. The device of claim 10, wherein the digital phase-locked loop is arranged to support different channel frequencies over a channel frequency range, and the processing circuit is arranged for performing both the calibrating step and waiting step respectively for all the different channel frequencies in the channel frequency range to determine the current level required by the digitally controlled oscillator.

15. The device of claim 9, wherein the processing circuit is arranged for decreasing the current flowing through the current source from the first current level to the lower current level based on a fixed step size.

16. The device of claim 9, wherein the processing circuit is arranged for decreasing the current flowing through the current source from the first current level to the lower current level gradually without a fixed step size.

17. A processing circuit for tuning a current source of a digitally controlled oscillator of a digital phase-locked loop, the processing circuit being coupled to the digital phase-locked loop having the digitally controlled oscillator having a current source and an LC tank, the LC tank having a tunable capacitor bank, and the processing circuit comprises:
    a controlling circuit, coupled to the digitally controlled oscillator, used for:
        determining a specific threshold according to a resolution of a bit number of the tunable capacitor bank;
        configuring a current flowing through the current source at a first current level;
        tuning the current flowing through the current source from the first current level to a lower current level;
        comparing a variation of a digital value of the tunable capacitor bank with the specific threshold, the digital value corresponding to the lower current level; and determining that a current level required by the digitally controlled oscillator is decreased down to the lower current level and then configuring the current flowing through the current source at the lower current level if the variation of the digital value is smaller than the specific threshold.

18. The processing circuit of claim 17, wherein the controlling circuit is arranged for:

reading the digital value from the tunable capacitor bank as a reference capacitor bank value when the current flowing through the current source is configured as the first current level;

calibrating the current flowing through the current source from the first current level to a second current level which is lower than the first current level;

waiting for an execution of a frequency tracking operation which is executed based on the second current level provided for the digitally controlled oscillator;

reading the digital value from the tunable capacitor bank as a second capacitor bank value when the execution of the frequency tracking operation is finished;

calculating an absolute difference value between the second capacitor bank value and the reference capacitor bank value;

comparing the absolute difference value with the specific threshold; and determining that the current level required by the digitally controlled oscillator is decreased down to the second current level and then configuring the current flowing through the current source at the second current level if the absolute difference value is smaller than the specific threshold.

* * * * *